(12) United States Patent
Kapre et al.

(10) Patent No.: US 8,252,640 B1
(45) Date of Patent: Aug. 28, 2012

(54) POLYCRYSTALLINE SILICON ACTIVATION RTA

(76) Inventors: Ravindra M. Kapre, San Jose, CA (US); Sethuraman Lakshminarayanan, San Jose, CA (US)

(*) Notice: Subject to any disclaimer, the term of this patent is extended or adjusted under 35 U.S.C. 154(b) by 562 days.

(21) Appl. No.: 11/555,905

(22) Filed: Nov. 2, 2006

(51) Int. Cl.
H01L 21/336 (2006.01)

(52) U.S. Cl. .......... 438/197; 438/303; 438/585

(58) Field of Classification Search .......... 438/197, 438/303, 585; 257/E21.001
See application file for complete search history.

(56) References Cited

U.S. PATENT DOCUMENTS

| | | | |
|---|---|---|---|
| 4,415,385 A | 11/1983 | Saito et al. |
| 4,580,503 A | 4/1986 | Astrom |
| 4,833,099 A | 5/1989 | Woo |
| 5,385,866 A | 1/1995 | Bartush |
| 5,393,685 A | 2/1995 | Yoo et al. |
| 5,464,789 A | 11/1995 | Saito |
| 5,492,734 A | 2/1996 | Matsumoto et al. |
| 5,496,859 A | 3/1996 | Fong et al. |
| 5,516,283 A | 5/1996 | Schrems |
| 5,633,523 A | 5/1997 | Kato |
| 5,679,585 A | 10/1997 | Gardner et al. |
| 5,710,454 A | 1/1998 | Wu |
| 5,721,090 A | 2/1998 | Okamoto et al. |
| 5,753,303 A | 5/1998 | Cote et al. |
| 5,756,392 A | 5/1998 | Lu et al. |
| 5,796,151 A | 8/1998 | Hsu et al. |
| 5,798,296 A | 8/1998 | Fazan et al. |
| 5,817,579 A | 10/1998 | Ko et al. |
| 5,877,074 A | 3/1999 | Jeng et al. |
| 5,913,123 A | 6/1999 | Lin |
| 5,937,289 A | 8/1999 | Bronner et al. |
| 5,962,763 A | 10/1999 | Cossee et al. |
| 6,037,197 A | 3/2000 | Yamazaki et al. |
| 6,037,238 A | 3/2000 | Chang et al. |
| 6,087,063 A | 7/2000 | Hada et al. |
| 6,107,135 A | 8/2000 | Kleinhenz et al. |
| 6,110,789 A | 8/2000 | Rhodes |
| 6,117,795 A | 9/2000 | Pasch |
| 6,121,124 A | 9/2000 | Liu |
| 6,127,227 A | 10/2000 | Lin et al. |
| 6,165,884 A | 12/2000 | Lee et al. |
| 6,177,334 B1 | 1/2001 | Chen et al. |
| 6,180,453 B1 | 1/2001 | Sung et al. |
| 6,180,501 B1 | 1/2001 | Pey |
| 6,188,136 B1 | 2/2001 | Asamura |
| 6,194,128 B1 | 2/2001 | Tao et al. |
| 6,228,752 B1 | 5/2001 | Miyano |
| 6,232,163 B1 | 5/2001 | Voldman et al. |
| 6,247,245 B1 | 6/2001 | Ishii |
| 6,251,777 B1 | 6/2001 | Jeng et al. |
| 6,258,677 B1 | 7/2001 | Ang et al. |

(Continued)

FOREIGN PATENT DOCUMENTS

EP 0 327 210 A1 8/1989

(Continued)

OTHER PUBLICATIONS

Ota, K. et al., "Novel locally strained channel technique for high performance 55nm CMOS", IEDM, 4 pages, (2002).

(Continued)

*Primary Examiner* — Jack Chen

(57) ABSTRACT

A method of forming a semiconductor structure includes rapid thermal annealing of a gate stack on a semiconductor substrate at a temperature of at least 950° C., followed by forming source/drain regions in the semiconductor substrate.

9 Claims, 2 Drawing Sheets

U.S. PATENT DOCUMENTS

| | | | |
|---|---|---|---|
| 6,265,297 | B1 | 7/2001 | Powell |
| 6,271,077 | B1 | 8/2001 | Nakabayashi et al. |
| 6,274,467 | B1 | 8/2001 | Gambino et al. |
| 6,277,200 | B2 | 8/2001 | Xia et al. |
| 6,278,129 | B1 | 8/2001 | Sugasawara et al. |
| 6,284,633 | B1 | 9/2001 | Nagabushnam et al. |
| 6,287,913 | B1 | 9/2001 | Agnello et al. |
| 6,297,539 | B1 | 10/2001 | Ma et al. |
| 6,303,482 | B1 | 10/2001 | Wu et al. |
| 6,303,483 | B1 | 10/2001 | Kunikiyo |
| 6,306,743 | B1 | 10/2001 | Lee |
| 6,325,017 | B1 | 12/2001 | DeBoer et al. |
| 6,342,452 | B1 | 1/2002 | Coronel et al. |
| 6,372,672 | B1 | 4/2002 | Kim et al. |
| 6,380,008 | B2 | 4/2002 | Kwok et al. |
| 6,410,428 | B1 | 6/2002 | Chiang et al. |
| 6,413,871 | B2 | 7/2002 | M'Saad et al. |
| 6,417,551 | B2 | 7/2002 | Miyano |
| 6,429,135 | B1 | 8/2002 | Chern et al. |
| 6,429,496 | B1 | 8/2002 | Li et al. |
| 6,435,868 | B2 | 8/2002 | White et al. |
| 6,448,140 | B1 | 9/2002 | Liaw |
| 6,451,647 | B1 | 9/2002 | Yang et al. |
| 6,458,714 | B1 | 10/2002 | Powell |
| 6,465,335 | B1 | 10/2002 | Kunikiyo |
| 6,465,370 | B1 | 10/2002 | Schrems et al. |
| 6,465,837 | B1 | 10/2002 | Wu et al. |
| 6,479,405 | B2 | 11/2002 | Lee et al. |
| 6,485,203 | B2 | 11/2002 | Katano et al. |
| 6,500,720 | B2 | 12/2002 | Kunikiyo |
| 6,506,647 | B2 | 1/2003 | Kuroda et al. |
| 6,509,254 | B1 | 1/2003 | Matsumoto et al. |
| 6,514,841 | B2 | 2/2003 | Kim et al. |
| 6,515,843 | B2 | 2/2003 | Nakabayashi et al. |
| 6,518,636 | B2 | 2/2003 | Segawa |
| 6,534,805 | B1 | 3/2003 | Jin |
| 6,541,830 | B1 | 4/2003 | Iyer |
| 6,552,401 | B1 | 4/2003 | Dennison |
| 6,559,007 | B1 | 5/2003 | Weimer |
| 6,562,730 | B2 | 5/2003 | Jeng |
| 6,573,159 | B1 | 6/2003 | Kobayashi et al. |
| 6,585,430 | B2 | 7/2003 | Matsuyama et al. |
| 6,592,678 | B1 | 7/2003 | Kamikawa et al. |
| 6,602,746 | B2 | 8/2003 | Tanaka |
| 6,624,068 | B2 | 9/2003 | Thakar et al. |
| 6,635,185 | B2 | 10/2003 | Demmin et al. |
| 6,642,623 | B2 | 11/2003 | McTeer |
| 6,680,516 | B1 | 1/2004 | Blosse et al. |
| 6,686,242 | B2 | 2/2004 | Willer et al. |
| 6,686,617 | B2 | 2/2004 | Agnello et al. |
| 6,740,566 | B2 | 5/2004 | Lyons et al. |
| 6,767,834 | B2 | 7/2004 | Chung et al. |
| 6,774,012 | B1 | 8/2004 | Narayanan |
| 6,794,279 | B1 | 9/2004 | Stephen |
| 6,797,575 | B2 | 9/2004 | Kim et al. |
| 6,803,321 | B1 | 10/2004 | Blosse et al. |
| 6,812,529 | B2 | 11/2004 | Trivedi et al. |
| 6,828,634 | B2 | 12/2004 | Oshima |
| 6,897,120 | B2 | 5/2005 | Trapp |
| 6,902,993 | B2 | 6/2005 | Blosse et al. |
| 6,984,575 | B2 | 1/2006 | Yamamoto |
| 7,189,652 | B1 | 3/2007 | Blosse et al. |
| 7,229,929 | B2 | 6/2007 | Chowdhury |
| 7,252,773 | B2 | 8/2007 | Hall |
| 7,351,663 | B1 | 4/2008 | Kabansky et al. |
| 2002/0058410 | A1 | 5/2002 | Sung et al. |
| 2002/0173105 | A1* | 11/2002 | Park et al. ............... 438/279 |
| 2003/0020111 | A1 | 1/2003 | Bevan |
| 2004/0214448 | A1 | 10/2004 | Chan et al. |

FOREIGN PATENT DOCUMENTS

| | | |
|---|---|---|
| WO | WO 00/03425 A1 | 1/2000 |

OTHER PUBLICATIONS

Kirk-Othmer, Encyclopedia of Chemical Technology, vol. 14, pp. 677-709, (1995).

Booth, R.V. et al., "The effect of channel implants on MOS transistor characterization", IEEE Transactions on Electron Devices, pp. 2501-2509, vol. ED-34, No. 12, (1987).

Bhavnagarwala, A.J. et. al, "The impact of intrinsic device fluctuations on CMOS SRAM cell stability", IEEE Journal of Solid-State Circuits, vol. 36, No. 4, pp. 658-665, (2001).

Seevinck, E. et. al., "Static-noise margin analysis of MOS SRAM cells", IEEE Journal of Solid-State Circuits, vol. SC-22, No. 5, pp. 748-754, (1987).

U.S. Appl. No. 10/185,646: "Nitride Layer on a Gate Stack," Blosse et al., filed on Jun. 28, 2002; 19 pages.

USPTO Miscellaneous Action for U.S. Appl. No. 10/185,646 dated Jul. 16, 2007; 1 page.

USPTO Notice of Allowance for U.S. Appl. No. 10/185,646 dated Apr. 9, 2007; 5 pages.

USPTO Final Rejection for U.S. Appl. No. 10/185,646 dated Jan. 23, 2007; 7 pages.

USPTO Requirement for Restriction/Election for U.S. Appl. No. 10/185,646 dated Dec. 18, 2006; 5 pages.

USPTO Non-Final Rejection for U.S. Appl. No. 10/185,646 dated Jul. 13, 2006; 5 pages.

USPTO Ex Parte Quayle Action for U.S. Appl. No. 10/185,646 dated Feb. 24, 2006; 4 pages.

USPTO Non-Final Rejection for U.S. Appl. No. 10/185,646 dated Aug. 24, 2005; 6 pages.

USPTO Non-Final Rejection for U.S. Appl. No. 10/185,646 dated Mar. 9, 2005; 11 pages.

USPTO Miscellaneous Action for U.S. Appl. No. 10/185,646 dated Dec. 14, 2004; 2 pages.

USPTO Non-Final Rejection for U.S. Appl. No. 10/185,646 dated Aug. 24, 2004; 11 pages.

USPTO Non-Final Rejection for U.S. Appl. No. 10/185,646 dated Mar. 25, 2004; 10 pages.

USPTO Non-Final Rejection for U.S. Appl. No. 10/185,646 dated Sep. 25, 2003; 8 pages.

USPTO Requirement for Restriction/Election for U.S. Appl. No. 10/185,646 dated Jun. 11, 2003; 4 pages.

U.S. Appl. No. 10/314,380: "Multi-Layer Gate Stack," Saurabh Dutta Chowdhury, filed on Dec. 6, 2002; 24 pages.

USPTO Notice of Allowance for U.S. Appl. No. 10/314,380 dated Jan. 25, 2007; 6 pages.

USPTO Non-Final Rejection for U.S. Appl. No. 10/314,380 dated Jul. 27, 2006; 9 pages.

USPTO Non-Final Rejection for U.S. Appl. No. 10/314,380 dated Feb. 22, 2006; 10 pages.

USPTO Non-Final Rejection for U.S. Appl. No. 10/314,380 dated Sep. 1, 2005; 9 pages.

USPTO Final Rejection for U.S. Appl. No. 10/314,380 dated Apr. 29, 2005; 10 pages.

USPTO Non-Final Rejection for U.S. Appl. No. 10/314,380 dated Sep. 27, 2004; 9 pages.

USPTO Miscellaneous Action for U.S. Appl. No. 10/314,380 dated Jan. 8, 2004; 1 page.

U.S. Appl. No. 10/313,267: "Controlled Thickness Gate Stack," Blosse et al., filed on Dec. 6, 2002; 26 pages.

USPTO Notice of Allowance for U.S. Appl. No. 10/313,267 dated Aug. 26, 2003; 5 pages.

USPTO Non-Final Rejection for U.S. Appl. No. 10/313,267 dated Apr. 30, 2003; 5 pages.

U.S. Appl. No. 10/313,283: "Method for Cleaning a Gate Stack," Blosse et al., filed on Dec. 6, 2002; 31 pages.

USPTO Notice of Allowance for U.S. Appl. No. 10/313,283 dated Mar. 12, 2008; 7 pages.

USPTO Advisory Action for U.S. Appl. No. 10/313,283 dated Nov. 9, 2007; 3 pages.

USPTO Final Rejection for U.S. Appl. No. 10/313,283 dated Jul. 31, 2007; 10 pages.

USPTO Non-Final Rejection for U.S. Appl. No. 10/313,283 dated Apr. 24, 2007; 8 pages.

USPTO Non-Final Rejection for U.S. Appl. No. 10/313,283 dated Dec. 5, 2006; 9 pages.

USPTO Advisory Action for U.S. Appl. No. 10/313,283 dated Oct. 27, 2006; 3 pages.

USPTO Final Rejection for U.S. Appl. No. 10/313,283 dated Jul. 27, 2006; 9 pages.
USPTO Non-Final Rejection for U.S. Appl. No. 10/313,283 dated Feb. 15, 2006; 9 pages.
USPTO Advisory Action for U.S. Appl. No. 10/313,283 dated Jan. 6, 2006; 3 pages.
USPTO Final Rejection for U.S. Appl. No. 10/313,283 dated Sep. 21, 2005; 8 pages.
USPTO Non-Final Rejection for U.S. Appl. No. 10/313,283 dated Apr. 12, 2005; 11 pages.
U.S. Appl. No. 10/313,048: Selective Oxidation of Gate Stack, Blosse et al., filed on Dec. 6, 2002; 25 pages.
USPTO Notice of Allowance for U.S. Appl. No. 10/313,048 dated Oct. 31, 2006; 6 pages.
USPTO Non-Final Rejection for U.S. Appl. No. 10/313,048 dated Aug. 17, 2006; 8 pages.
USPTO Advisory Action for U.S. Appl. No. 10/313,048 dated Jun. 13, 2006; 3 pages.
USPTO Final Rejection for U.S. Appl. No. 10/313,048 dated Apr. 19, 2006; 10 pages.
USPTO Non-Final Rejection for U.S. Appl. No. 10/313,048 dated Oct. 31, 2005; 8 pages.
USPTO Non-Final Rejection for U.S. Appl. No. 10/313,048 dated Jun. 23, 2005; 8 pages.
USPTO Requirement for Restriction/Election for U.S. Appl. No. 10/313,048 dated Mar. 3, 2005; 4 pages.
U.S. Appl. No. 10/313,049 : "Nitride Spacer Formation," Blosse et al., filed on Dec. 6, 2002; 25 pages.
USPTO Notice of Allowance for U.S. Appl. No. 10/313,049 dated May 7, 2004; 4 pages.
USPTO Final Rejection for U.S. Appl. No. 10/313,049 dated Feb. 24, 2004; 9 pages.
USPTO Requirement for Restriction/Election for U.S. Appl. No. 10/313,049 dated Oct. 22, 2003; 4 pages.
USPTO Non-Final Rejection for U.S. Appl. No. 10/313,049 dated Apr. 4, 2003; 9 pages.
USPTO Notice of Allowance for U.S. Appl.No. 10/402,750 dated Feb. 7, 2005; 7 pages.
USPTO Non-Final Rejection for U.S. Appl. No. 10/402,750 dated Aug. 26, 2004; 9 pages.
USPTO Requirement Restriction for U.S. Appl. No. 10/402,750 dated Jul. 6, 2004; 5 pages.
USPTO Miscellaneous Action for U.S. Appl. No. 10/402,750 dated Mar. 5, 2004; 1 page.
R. Malik, et al., "W/WN/Poly gate Implementation for sub-130 nm vertical cell DRAM"; 2001 IEEE Symposium on VLSI Technology Digest of Technical Papers; 2 pages.
Tanaka, Masayuki, et al., "Realization of High Performance Dual Gate DRAMs without Boron Penetration by Application of Terachlorosilane Silicon Nitride Films": 2001 IEEE Symposium on VLSI Technology Digest of Technical Papers; 2 pages.
USPTO Requirement Restriction for U.S. Appl. No. 10/186,453 dated Feb. 28, 2003; 4 pages.
Hee Han, et al., "Reaction barrier formation of W/poly-Si gate by NH3 rapid thermal annealing applicable to 0.15 um CMOS Devices": 2000 IEEE, pp. 67-69.
USPTO Notice of Allowance for U.S. Appl. No. 10/290,841 dated Mar. 17, 2004; 6 pages.
USPTO Non-Final Rejection for U.S. Appl. No. 10/186,453 dated Jun. 6, 2003; 10 pages.
USPTO Requirement Restriction for U.S. Appl. No. 10/290,841 dated Nov. 3, 2003; 4 pages.
Robert F. Pierret, "Semiconductor Device Fundamentals," Addison-Wesley Publishing Company, 1996; 34 pages.
Peter Van Zant, "Microchip Fabrication a Practical Guide to Semiconductor Processing," Third Edition, McGraw-Hill, 1997; 39 pages.

Wolf et al., "Process Technology vol. 1 for the VLSI Era," Lattice Press, 1986-2002; pp. 72-78.
"Material Safety Data Sheet," EKC Technology, Product Name: EKC265, I.E. du Pont de Nemours and Company, Nov. 2004, pp. 1-10; 10 pages.
Kern et al., "Advances in Deposition Processes for Passivation Films," Journal of Vacuum Science & Technology B, Sep./Oct. 1977, vol. 14, No. 5, pp. 1082-1099; 18 pages.
Kim et al., "Sidewall Oxidation Behavior of Dichlorosilane-Based W-Polycide Gate," Journal of Vacuum Science & Technology B, vol. 19, No. 2, (2001), pp. 361-365; 5 pages.
USPTO Notice of Allowance for U.S. Appl. No. 11/169,176 dated Nov. 1, 2007; 6 pages.
USPTO Final Rejection for U.S. Appl. No. 11/169,176 dated Jul. 10, 2007; 8 pages.
USPTO Non-Final Rejection for U.S. Appl. No. 11/169,176 dated Feb. 5, 2007; 7 pages.
USPTO Non-Final Rejection for U.S. Appl. No. 11/169,176 dated Oct. 2, 2006; 6 pages.
USPTO Notice of Allowance for U.S. Appl. No. 10/186,453 dated Jul. 28, 2009; 4 pages.
USPTO Non-Final Rejection for U.S. Appl. No. 10/186,453 dated Feb. 9, 2009; 10 pages.
USPTO Advisory Action for U.S. Appl. No. 10/186,453 dated Oct. 8, 2008; 3 pages.
USPTO Final Rejection for U.S. Appl. No. 10/186,453 dated May 20, 2008; 15 pages.
USPTO Miscellaneous Action with SSP for U.S. Appl. No. 10/186,453 dated Jan. 15, 2008; 2 pages.
USPTO Non-Final Rejection for U.S. Appl. No. 10/186,453 dated Aug. 8, 2007; 11 pages.
USPTO Advisory Action for U.S. Appl. No. 10/186,453 dated Mar. 28, 2007; 3 pages.
USPTO Final Rejection for U.S. Appl. No. 10/186,453 dated Feb. 8, 2007; 11 pages.
USPTO Non-Final Rejection for U.S. Appl. No. 10/186,453 dated Aug. 18, 2006; 7 pages.
USPTO Miscellaneous Action with SSP for U.S. Appl. No. 101186,453 dated May 2, 2006; 2 pages.
USPTO Advisory Action for U.S. Appl. No. 10/186,453 dated Dec. 1, 2005; 3 pages.
USPTO Final Rejection for U.S. Appl. No. 10/186,453 dated Aug. 8, 2005; 8 pages.
USPTO Non-Final Rejection for U.S. Appl. No. 10/186,453 dated Jan. 11, 2005; 7 pages.
USPTO Advisory Action for U.S. Appl. No. 10/186,453 dated Oct. 26, 2004; 3 pages.
USPTO Final Rejection for U.S. Appl. No. 10/186,453 dated Apr. 28, 2004; 8 pages.
U.S. Appl. No. 11/469,568: "Method of Eliminating Whisker Defects," Sundar Narayanan, filed on Sep. 1, 2006; 15 pages.
USPTO Non-Final Rejection for U.S. Appl. No. 11/469,568 dated Nov. 24, 2008; 17 pages.
U.S. Appl. No. 11/469,572: "Method of Preventing Whisker Defects," Sundar Narayanan et al., filed on Sep. 1, 2006; 16 pages.
USPTO Non-Final Rejection for U.S. Appl. No. 11/469,572 dated Feb. 7, 2008; 10 pages.
USPTO Non-Final Rejection for U.S. Appl. No. 11/469,572 dated Aug. 18, 2008; 9 pages.
USPTO Final Rejection for U.S. Appl. No. 11/469,572 dated Sep. 4, 2008; 12 pages.
Encyclopedia of Chemical Technology, Kirk-Othmer, 1995, vol. 14, pp. 677-709.
Han et al., "Reaction Barrier Formation of W/Poly-Si Gate by NH3 Rapid Thermal Annealing Applicable to 0.15 um CMOS Devices," 2000, IEEE, pp. 67-69.

* cited by examiner

POLYCRYSTALLINE SILICON ACTIVATION RTA

BACKGROUND

A semiconductor device typically includes a metal oxide semiconductor (MOS) transistor, which includes a gate stack. FIG. 1 illustrates a conventional gate stack including a gate electrode 110', where the gate stack is on a semiconductor substrate 101. As shown in FIG. 1, the gate electrode 110' is on a gate insulator 102, which is on the semiconductor substrate 101. A capping layer 121, typically containing silicon nitride, is on the gate electrode 110'. Also illustrated in FIG. 1, the gate electrode 110' includes a metal layer 115' (typically containing tungsten), on a refractory layer 114 (typically containing tungsten nitride), which is on a diffusion barrier layer 117 (typically containing titanium nitride). The diffusion barrier layer 117 is on a conductive layer 116 (typically containing titanium silicide), which is on a gate layer 112' (typically containing polycrystalline silicon (poly)). The gate layer is implanted with ions, such as $As^+$, to enhance conductivity of the gate layer, right after formation of the gate layer and before the formation of other layers on the gate layer.

A conventional MOS transistor 210 containing the conventional gate stack is illustrated in FIG. 2. As shown, the transistor includes gate spacers 208 on either side of the gate stack. The transistor also includes source/drain regions 221 and 222, as well as isolation regions 201 in the substrate. During processing, the gate electrode 110' may loose nitrogen from the refractory layer 114, so that when the refractory layer contains tungsten nitride and the metal layer 115' contains tungsten, the refractory layer will merge into the metal layer 115'. The conventional MOS transistor and gate stack is described, for example, in U.S. Pat. No. 6,902,993 to Blosse et al. issued 7 Jun. 2005.

As part of processing the gate stack to form the conventional MOS transistor, the gate layer 112' of the gate electrode 200 is selectively oxidized, to form sidewall oxide 170, as illustrated in FIG. 3, where the portions of the gate electrode above the gate layer are collectively labeled 120. A sidewall oxide having a thickness of 50-70 angstroms is formed, for example, by exposing the gate stack to a mixture of hydrogen and oxygen (10% steam) at a temperature of 750° C. to selectively oxidize the poly relative to the tungsten and tungsten nitride. This selective oxidation of a gate stack is described in U.S. patent application Ser. No. 10/313,048 to Blosse et al. entitled "SELECTIVE OXIDATION OF GATE STACK" filed 6 Dec. 2002. After selective oxidation, additional processing is carried to complete formation of the semiconductor device, including implantation to form the source/drain regions in the semiconductor substrate, as well as annealing to activate the implanted ions in the source/drain regions and the gate layer. Typically, a single implant activation step is used for both the source/drain regions as well as the gate layer.

SUMMARY

In a first aspect, the present invention is a method of forming a semiconductor structure, comprising rapid thermal annealing of a gate stack on a semiconductor substrate at a temperature of at least 950° C., followed by forming source/drain regions in the semiconductor substrate.

In a second aspect, the present invention is a method of forming a semiconductor structure, comprising forming a gate stack comprising a gate layer on a semiconductor substrate, forming sidewall oxide on the gate layer, followed by activating the gate layer, followed by forming source/drain regions in the substrate.

In a third aspect, the present invention is a method of forming an SRAM device, comprising forming a gate stack comprising a gate layer on a semiconductor substrate, outgasing the gate stack, followed by activating the gate layer, followed by patterning the gate stack.

DETAILED DESCRIPTION

Figure 4:
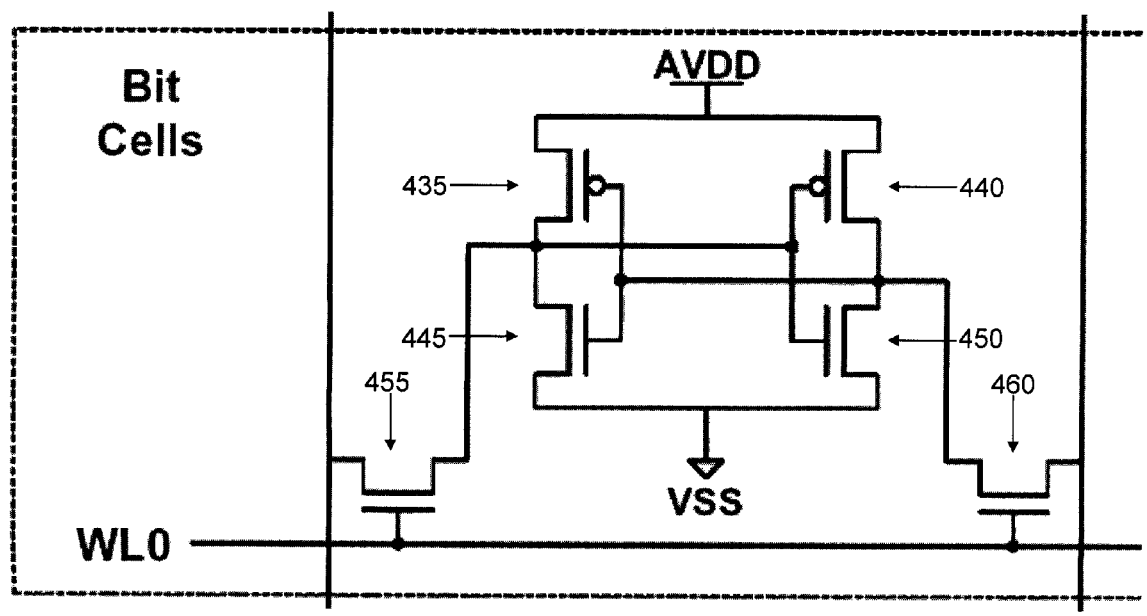
FIG. 4 is a schematic of a 6-T SRAM cell.

As the critical dimension of semiconductor devices continues to decrease, the width of the gate layer is reduced. Examples include sub 100 nm technologies, with minimum gate lengths of less than 100 nm, such as devices having a gate length of at most 90 nm, or at most 65 nm. When attempting to manufacture static random access memory (SRAM) integrated circuits (IC) with 18 megabits, variations in the transistor threshold voltages ($V_t$) lead to massive single bit failures, resulting in zero SRAM IC product yield. As shown in FIG. 4, each SRAM cell 400 is composed of 3 pairs of transistors: 2 pull-up transistors 435 and 440 (also known as PMOS Pull up 1 and 2, or PLTC 1 and 2), 2 pull-down transistors 445 and 450 (also known as NMOS Pull down 1 and 2, or NLTC 1 and 2), and 2 access transistors 455 and 460 (also known as NMOS Pass Gate 1 and 2, or NPAS 1 and 2). It was observed that one of the pair of transistors would have a $V_t$ much greater than the other, resulting is a mismatch within paired transistors. One possible explanation for this problem is that the dopant implanted into the gate layer was not properly distributed at the bottom of the layer, at the interface of the gate layer and the gate insulator.

The present invention makes use of the discovery of a method including the addition of a separate gate layer activation, by rapid thermal annealing (RTA), after formation of the gate stack, but before source/drain implantation. The RTA may be a soak RTA or a spike RTA. If the gate layer activation takes place before the gate stack is patterned, then the gate stack is outgassed by slow annealing to prevent bubble formation in the stack. Alternatively, if the gate layer activation takes place after the gate stack is patterned, selective oxidation is preferably carried out first to prevent loss of dopant from the gate sidewalls during annealing.

Figure 1:
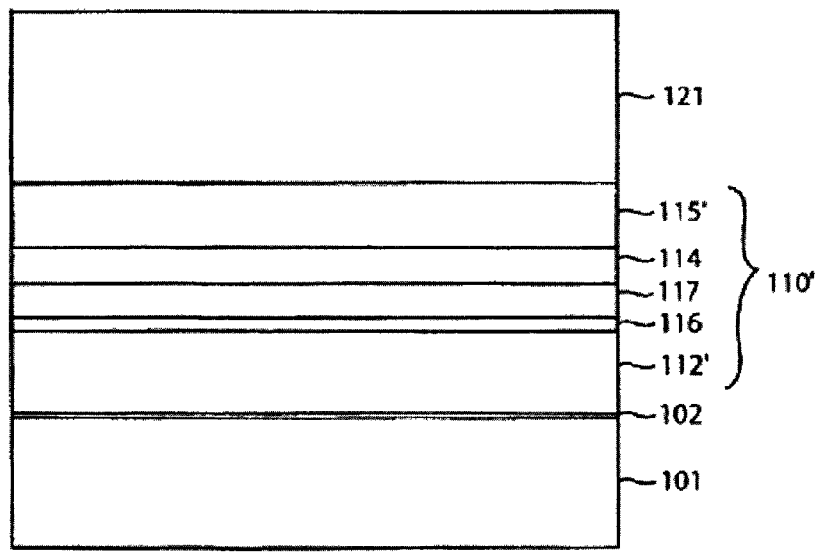
FIG. 1 shows a conventional gate stack including a gate electrode.
Figure 2:
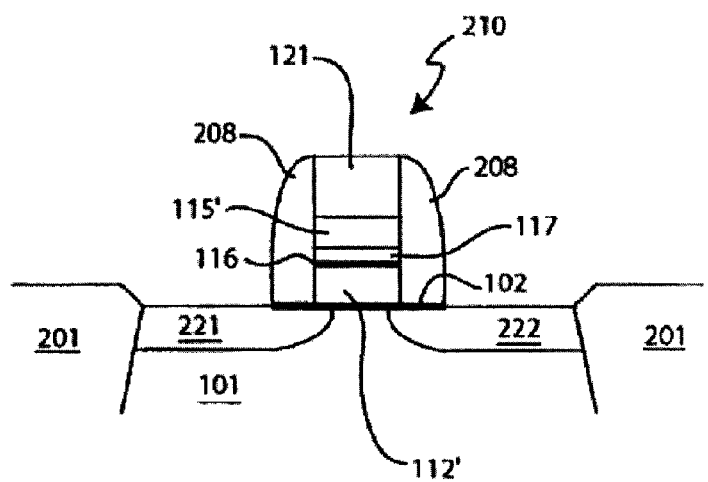
FIG. 2 shows a conventional MOS transistor.
Figure 3:
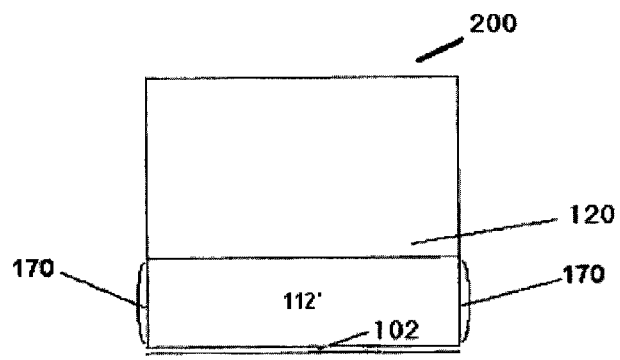
FIG. 3 shows a gate electrode having sidewall oxide.

The gate stacks may be formed by conventional methods, for example as described in U.S. Pat. No. 6,680,516 to Blosse et al. issued 20 Jan. 2004 and U.S. Pat. No. 6,902,993 to Blosse et al. issued 7 Jun. 2005. FIG. 1 illustrates a gate stack including a gate electrode 110', where the gate stack is on a semiconductor substrate 101. As shown in FIG. 1, the gate electrode 110' is on a gate insulator 102, which is on the semiconductor substrate 101. A capping layer 121 is on the gate electrode 110'. Also illustrated in FIG. 1, the gate electrode 110' includes a metal layer 115', on a refractory layer 114, which is itself on a diffusion barrier layer 117. The diffusion barrier layer 117 is on a conductive layer 116, which is on a gate layer 112'.

The gate layer may contain a variety of semiconductor materials. Typically, the gate layer contains poly or amorphous silicon. The gate layer may be doped with one type of dopant (P+ or N+), or it may contain both types of dopants in discrete regions. A split gate is a gate layer containing both P+ and N+ doping regions.

In the case of a split gate, those regions of the gate layer that are P+ doped (such as with B or $BF_2$) are over N− doped channel regions of the substrate, forming a PMOS device; those regions of the gate layer that are N+ doped (such as with As+ or phosphorus+) are over P− doped channel regions of the substrate, forming an NMOS device. The P+ and N+ doping regions of the gate layer are separated by a region which is on an isolation region of the substrate. The doping of the regions of the gate layer is preferably carried out after forming the gate layer, by masking and doping each region separately, or by an overall doping of the gate layer with one dopant type, and then masking and doping only one region with the other dopant type (counter doping).

The conductive layer preferably contains titanium, tantalum, zirconium, hafnium, cobalt, and mixture, alloys or compounds thereof, including titanium silicide. The conductive layer preferably has a thickness of 35-65 angstroms, more preferably 45-60 angstroms, based on the thickness of the layer as formed, before reaction with other layers. For example, if the conductive layer contains titanium silicide, it may be formed by forming a layer of titanium having a thickness of 35-65 angstroms prior to reaction with the gate layer to form titanium silicide.

The diffusion barrier layer on the conductive layer is optional. Preferably, the diffusion barrier layer contains titanium, tantalum, zirconium, hafnium, cobalt, and mixture, alloys or compounds thereof, including titanium nitride. This layer may be formed by reaction of nitrogen from the layer above, or by the reaction of ammonia with part of material applied to form the conductive layer.

The refractory layer on the conductive layer, or on the diffusion barrier layer, is also optional. Preferably, the refractory layer contains a nitride, such as titanium nitride or tungsten nitride. The thickness of the refractory layer, as applied, is preferably 25-75 angstroms.

The metal layer preferably contains a highly conductive metal such as tungsten. Preferably, the metal layer has a thickness of 300-500 angstroms, more preferably 350-450 angstroms, including 375-400 angstroms.

Thermal treatment of the gate electrode may be performed before forming the capping layer. Such a thermal treatment may result in some reaction of the layers of the gate electrode. For example, thermal treatment may cause reaction of the gate layer with the conductive layer to form silicide in the conductive layer, and/or the metal layer may pick up some nitrogen. The capping layer, which protects and electrically insulates the gate electrode, is preferably formed after the thermal treatment. The capping layer preferably is an insulator, such as a layer containing silicon nitride.

An optional slow anneal may be performed after forming the capping layer, for example after nitride deposition when the capping layer contains silicon nitride, if activating the gate layer will be carried out before patterning the gate stack. It is believed that the slow anneal removes trapped gas from the layers which form the gate stack (outgasing), especially in blank areas of the substrate, preventing bubble formation. The slow anneal is preferably carried out in a gas containing hydrogen, and preferably also containing an inert gas such as nitrogen, helium, argon or mixtures thereof. For example, the gas may contain a ratio of hydrogen:nitrogen of 1:20 to 1:1 (using, for example a flow rate of hydrogen of 2000 sccm and a flow rate of nitrogen of 20,000 sccm). Preferably, the slow anneal is carried out for 10 minutes to 5 hours, more preferably for 30 minutes to 2 hours, for example 1 hour. The temperature of the slow anneal is preferably 550-750° C., more preferably 600-700° C., for example 650° C. When heating the semiconductor structure to the temperature of the slow anneal, preferably heating is carried out quickly up to 300-375° C., and then ramped at a rate of at most 10° C./minute, for example 7° C./minute, from 300-375° C. to the slow anneal temperature. The slow anneal may be performed before or after patterning of the capping layer.

Rapid thermal annealing (RTA) is performed to activate the gate layer. Activating of the gate layer may be carried out after the slow anneal, or after formation of sidewall oxide by selective oxidation. The activating of the gate layer is separate from activating the source/drain region and carried out before implanting the source/drain regions. The activating may be performed before or after patterning of the capping layer, if carried out prior to gate stack patterning. When the activating of the gate layer is carried out before patterning the gate stack, any possible degradation of the metal layer/gate layer interface is avoided, so there will be no affect on the gate switching delay. The RTA may be a soak RTA or a spike RTA. The soak RTA is preferably carried out for 5-30 seconds, for example 10 seconds. The soak RTA is preferably carried out at a temperature of 950-1050° C., more preferably 975-1025° C., for example 1000° C. The spike RTA is carried out by heating to at temperature 1050-1150° C., such as 1075° C., and then immediately ending the heating, so the length of time of the RTA is one second or less. The RTA is preferably carried out in an inert gas such as nitrogen, helium, argon or mixtures thereof. The RTA may be performed before or after patterning of the capping layer; the gate stack and the gate electrode may be patterned after the RTA.

A sidewall oxide may be formed on the gate stack by selective oxidation. Selective oxidation is described in U.S. Pat. No. 6,774,012 to Sundar Narayanan issued 10 Aug. 2004, and U.S. patent application Ser. No. 10/313,048 to Blosse et al. entitled "SELECTIVE OXIDATION OF GATE STACK" filed 6 Dec. 2002. Preferably, the sidewall oxide is formed by oxidation in a gas containing hydrogen and oxygen; some or all of the hydrogen and oxygen may be in the form of compounds, such as water ($H_2O$), rather than in elemental form. Preferably, the gas contains more hydrogen (by volume or atomic percent) than oxygen. More preferably, the gas comprises at most 20% steam (water) by volume, more preferably 5-15% steam by volume, including 8-12% steam by volume. Preferably the gas comprises at least 80% hydrogen ($H_2$) by volume, more preferably 85-95% hydrogen ($H_2$) by volume, including 88-92% hydrogen ($H_2$) by volume.

Preferably, the selective oxidation is carried out at a temperature of at most 850° C., more preferably at a temperature of less than 850° C., even more preferably at 650-850° C., including 650-750° C. Preferably, the oxidation is selective for the gate layer over the metal layer, i.e. the thickness of oxide formed in contact with the metal layer will be thinner than the thickness of oxide in contact with the gate layer. Preferably, the ratio of the thickness of the sidewall oxide on P+: N+ doped regions of the gate layer will be at most 2:1, more preferably 2:1-1:1. Preferably, the thickness of the sidewall oxide is at most 100 angstroms, more preferably at most 70 angstroms; this includes thicknesses of 20-70 angstroms, more preferably 25-50 angstroms. Preferably, there will be no substantial variation in the sheet resistance of the metal layer, and preferably no substantial loss of metal layer thickness.

Other processing may be used to complete formation of semiconductor devices from the semiconductor structure. For example, source/drain regions may be formed in the substrate by implantation and activated by heating, spacers may be formed on the sides of the gate stack, additional dielectric layers may be formed on the substrate, and other contacts and metallization layers may be formed on these structures. These additional elements may be formed before, during, or after the method of the present invention.

The related processing steps, including the etching of the gate stack layers and other steps such as polishing, cleaning, and deposition steps, for use in the present invention are well known to those of ordinary skill in the art, and are also described in Encyclopedia of Chemical Technology, Kirk-Othmer, Volume 14, pp. 677-709 (1995); Semiconductor Device Fundamentals, Robert F. Pierret, Addison-Wesley, 1996; Wolf, Silicon Processing for the VLSI Era, Lattice Press, 1986, 1990, 1995, 2002 (vols 1-4, respectively); Microchip Fabrication 5th. edition, Peter Van Zant, McGraw-Hill, 2004; U.S. Pat. No. 6,803,321 to Blosse et al. issued 12 Oct. 2004; U.S. Pat. No. 6,774,012 to Sundar Narayanan issued 10 Aug. 2004; and U.S. Pat. No. 6,902,993 to Blosse et al. issued 7 Jun. 2005.

The semiconductor structures of the present invention may be incorporated into a semiconductor device such as an integrated circuit, for example a memory cell such as an SRAM (such as described in U.S. Pat. No. 6,534,805 to Bo Jin, issued 18 Mar. 2003), a DRAM, an EPROM, an EEPROM etc.; a programmable logic device; a data communications device; a clock generation device; etc. Furthermore, any of these semiconductor devices may be incorporated in an electronic device, for example a computer, mobile phone, an airplane or an automobile.

The present invention provides a greater static noise margin (SNM) for each cell of an SRAM device, than that of an otherwise identical SRAM device prepared with a single activation for both the gate layer and the source/drain regions. The SNM is greater for each SRAM cell, and the average SNM of the cells of the SRAM IC is also greater. Furthermore, the standard deviation ($\sigma$) of the SNM of the cells of the SRAM IC is less than that of an otherwise identical SRAM device prepared with a single activation for both the gate layer and the source/drain regions. The present invention also provides a standard deviation ($\sigma$) of the threshold voltage ($V_t$) of the transistors of the semiconductor device or IC that is less than that of an otherwise identical semiconductor device or IC prepared with a single activation for both the gate layer and the source/drain regions.

The tables below compare SNM and $V_t$ statistics of an SRAM IC prepared with a single activation for both the gate layer and the source/drain regions using a spike RTA at 1080° C. (old process), and or a first activation for the gate layer immediately after selective oxidation using an RTA at 1000° C. for 10 seconds, and a second activation for the source/drain regions using a spike RTA at 1080° C. (new process). Delta $V_t$ is the difference between the $V_t$ of two transistors within the same SRAM cell.

| N Pull Down Transistor Delta $V_t$ Statistics | Old Process | New Process |
| --- | --- | --- |
| Mean (V) | 0.009 | 0.0003 |
| Standard Deviation (V) | 0.067 | 0.057 |
| Standard Error of Mean (V) | 0.007 | 0.009 |
| Upper 95% Confidence Interval for Mean (V) | 0.024 | 0.018 |
| Lower 95% Confidence Interval for Mean (V) | −0.005 | −0.018 |

| N Pass Transistor Delta $V_t$ Statistics | Old Process | New Process |
| --- | --- | --- |
| Mean (V) | −0.003 | 0.011 |
| Standard Deviation (V) | 0.078 | 0.053 |
| Standard Error of Mean (V) | 0.009 | 0.008 |
| Upper 95% Confidence Interval for Mean (V) | 0.014 | 0.028 |
| Lower 95% Confidence Interval for Mean (V) | −0.02 | −0.005 |

| N Pull Down Transistor $V_t$ Statistics | Old Process | New Process |
| --- | --- | --- |
| Mean (V) | 0.461 | 0.57 |
| Standard Deviation (V) | 0.045 | 0.035 |
| Standard Error of Mean (V) | 0.0064 | 0.0028 |
| Upper 95% Confidence Interval for Mean (V) | 0.474 | 0.576 |
| Lower 95% Confidence Interval for Mean (V) | 0.448 | 0.564 |

| SRAM Cell SNM Statistics | Old Process | New Process |
| --- | --- | --- |
| Mean (V) | 0.104 | 0.146 |
| Standard Deviation (V) | 0.026 | 0.022 |
| Standard Error of Mean (V) | 0.006 | 0.003 |
| Upper 95% Confidence Interval for Mean (V) | 0.116 | 0.153 |
| Lower 95% Confidence Interval for Mean (V) | 0.091 | 0.139 |

What is claimed is:

1. A method of forming a semiconductor structure, comprising:
    forming a gate stack comprising a gate layer, on a semiconductor substrate;
    forming sidewall oxide on the gate layer;
    slow annealing the gate stack after forming the sidewall oxide; followed by
    activating the gate layer, wherein activating the gate layer comprises a rapid thermal annealing of the gate stack; followed by
    forming source/drain regions in the substrate.

2. The method of claim 1, wherein the slow annealing of the gate stack is at a temperature of 550-750° C. for a duration between 10 minutes and 5 hours.

3. The method of claim 1, wherein the slow annealing of the gate stack is at a temperature of 600-700° C. for a duration between 30 minutes and 2 hours.

4. The method of claim 1, wherein
    the gate layer comprises silicon, and
    the gate stack comprises:
        a conductive layer, on the gate layer,
        a metal layer, on the conductive layer, and
        a capping layer on the metal layer.

5. The method of claim 4, wherein
the conductive layer comprises titanium,
the metal layer comprises tungsten, and
the capping layer comprises silicon nitride.

6. The method of claim 4, wherein the rapid thermal annealing of the gate stack is at a temperature of 950-1150° C.

7. The method of claim 6, wherein the rapid thermal annealing of the gate stack is carried out for at most 30 seconds.

8. The method of claim 6, further comprising patterning the gate stack, before the rapid thermal annealing.

9. The method of claim 8, further comprising, before the rapid thermal annealing, forming sidewall oxide on the gate layer.

* * * * *